(12) United States Patent
Rehn et al.

(10) Patent No.: US 10,352,522 B2
(45) Date of Patent: Jul. 16, 2019

(54) ILLUMINATION DEVICE FOR VARIABLE ILLUMINATION

(71) Applicant: OSRAM GmbH, Munich (DE)

(72) Inventors: Henning Rehn, Berlin (DE); Sergey Khrushchev, Regensburg (DE)

(73) Assignee: OSRAM GMBH, Munich (DE)

( * ) Notice: Subject to any disclaimer, the term of this patent is extended or adjusted under 35 U.S.C. 154(b) by 371 days.

(21) Appl. No.: 15/508,134

(22) PCT Filed: Aug. 26, 2015

(86) PCT No.: PCT/EP2015/069482
§ 371 (c)(1),
(2) Date: Mar. 2, 2017

(87) PCT Pub. No.: WO2016/034460
PCT Pub. Date: Mar. 10, 2016

(65) Prior Publication Data
US 2017/0284622 A1 Oct. 5, 2017

(30) Foreign Application Priority Data
Sep. 2, 2014 (DE) .......................... 10 2014 217 521

(51) Int. Cl.
*F21V 5/00* (2018.01)
*F21V 14/04* (2006.01)
(Continued)

(52) U.S. Cl.
CPC ............. *F21S 41/285* (2018.01); *F21S 41/14* (2018.01); *F21S 41/16* (2018.01); *F21S 41/265* (2018.01);
(Continued)

(58) Field of Classification Search
CPC ...... F21S 41/285; F21S 41/675; F21S 41/265; F21S 41/14; F21S 41/16; F21S 41/36;
(Continued)

(56) References Cited

U.S. PATENT DOCUMENTS 10,168,465 B2 * 1/2019 Takahashi ............ G02B 6/0068
2001/0026450 A1 10/2001 Li
(Continued)

FOREIGN PATENT DOCUMENTS

AT 513909 A1 8/2014
CN 101493572 A 7/2009
(Continued)

OTHER PUBLICATIONS

German Search Report based on application No. 10 2014 217 521.6 (9 pages) dated May 8, 2015 (for reference purpose only).
(Continued)

*Primary Examiner* — William C. Dowling
(74) *Attorney, Agent, or Firm* — Viering Jentschura & Partner MBB (57) ABSTRACT

An illumination device for variable illumination in different spatial directions is provided. The illumination device includes a pump radiation unit, which has a pump radiation source for emitting pump radiation, a luminescent element for at least partial conversion of the pump radiation into illumination light, which is emitted in response to excitation with the pump radiation on an illumination light emission surface of the luminescent element, and optics which are assigned to the luminescent element and respectively direct illumination light ray bundles, which come from different positions of the illumination light emission surface and strike the optics on a luminescent material side, into a different spatial direction of the propagation on an illumination side opposite to the luminescent material side, The
(Continued)

pump radiation unit is configured to respectively emit a pump ray bundle adjustably in different spatial directions, which pump ray bundles are coupled in on the illumination side.

16 Claims, 4 Drawing Sheets

(51) Int. Cl.

| | | |
|---|---|---|
| *F21S 41/20* | (2018.01) | |
| *F21V 9/30* | (2018.01) | |
| *F21S 41/14* | (2018.01) | |
| *F21S 41/36* | (2018.01) | |
| *F21S 41/265* | (2018.01) | |
| *F21S 41/675* | (2018.01) | |
| *H01S 5/00* | (2006.01) | |
| *G02B 19/00* | (2006.01) | |
| *F21S 41/16* | (2018.01) | |
| *F21Y 115/30* | (2016.01) | |
| *F21Y 115/10* | (2016.01) | |
| *H01S 5/323* | (2006.01) | |
| *H01S 5/40* | (2006.01) | |
| *F21S 41/365* | (2018.01) | |

(52) U.S. Cl.
CPC ............. *F21S 41/36* (2018.01); *F21S 41/675* (2018.01); *F21V 5/008* (2013.01); *F21V 9/30* (2018.02); *F21V 14/04* (2013.01); *G02B 19/0014* (2013.01); *G02B 19/0047* (2013.01); *H01S 5/005* (2013.01); *F21S 41/365* (2018.01); *F21Y 2115/10* (2016.08); *F21Y 2115/30* (2016.08); *H01S 5/0071* (2013.01); *H01S 5/32341* (2013.01); *H01S 5/4025* (2013.01)

(58) Field of Classification Search
CPC ........ F21V 9/30; F21V 5/008; F21V 14/0014; G03B 19/0047; H01S 5/005
See application file for complete search history.

(56) References Cited

U.S. PATENT DOCUMENTS

| | | | |
|---|---|---|---|
| 2009/0116243 A1 | 5/2009 | Condon et al. | |
| 2013/0155648 A1 | 6/2013 | Morgenbrod et al. | |
| 2014/0009938 A1 | 1/2014 | Hossfeld | |
| 2015/0176778 A1* | 6/2015 | Schwaiger | F21V 23/003 |
| | | | 362/84 |
| 2018/0156409 A1* | 6/2018 | Schwaiger | H01S 5/005 |
| 2018/0342629 A1* | 11/2018 | Yamanaka | F21S 41/16 |

FOREIGN PATENT DOCUMENTS

| | | |
|---|---|---|
| CN | 103124514 A | 5/2013 |
| JP | 2014013758 A | 1/2014 |
| WO | 2012025141 A1 | 3/2012 |

OTHER PUBLICATIONS

International Search Report based on application No. PCT/EP2015/069482 (12 pages) dated Dec. 2, 2015 (for reference purpose only).
Chinese office action including search report based on Chinese application No. 201580046900 (6 pages and 6 pages translation) dated Jul. 18, 2018 (for reference purposes only).

* cited by examiner

ILLUMINATION DEVICE FOR VARIABLE ILLUMINATION

RELATED APPLICATIONS

The present application is a national stage entry according to 35 U.S.C. § 371 of PCT application No.: PCT/EP2015/069482 filed on Aug. 26, 2015, which claims priority from German application No.: 10 2014 217 521.6 filed on Sep. 2, 2014, and is incorporated herein by reference in its entirety.

TECHNICAL FIELD

The present disclosure relates to an illumination device having a pump radiation unit for emitting pump radiation and a luminescent element for at least partial conversion of the pump radiation.

BACKGROUND

As light sources with a high luminance, gas discharge lamps are still currently the most widespread. More recent developments, however, are tending to combine a pump radiation source of high power density, for example a laser, with a luminescent element arranged at a distance therefrom. The luminescent element converts the pump radiation at least partially, and thus emits in response to the excitation conversion radiation, i.e. illumination light which has at least components in the visible spectral range.

The technical object of the present disclosure is to provide an advantageous illumination device having a pump radiation unit and a luminescent element.

SUMMARY

According to the present disclosure, this object is achieved by an illumination device for variable illumination in different spatial directions having a pump radiation unit, which has a pump radiation source for emitting pump radiation, a luminescent element for at least partial conversion of the pump radiation into illumination light, which is emitted in response to excitation with the pump radiation on an illumination light emission surface of the luminescent element, optics which are assigned to the luminescent element and respectively direct illumination light ray bundles, which come from different positions of the illumination light emission surface and strike the optics on a luminescent material side, into a different spatial direction of the propagation on an illumination side opposite to the luminescent material side, i.e. they convert a position distribution on the illumination light emission surface into an angular distribution on the illumination side, wherein the pump radiation unit is configured to respectively emit a pump ray bundle adjustably in different spatial directions, which pump ray bundles are coupled in on the illumination side, i.e. are guided by the optics onto the illumination light emission surface of the luminescent element, so that the optics convert the angular distribution on the illumination side into a position distribution on the illumination light emission surface, i.e. they direct the pump ray bundles emitted in different spatial directions onto different positions of the illumination light emission surface, so that different positions of the luminescent element can be adjustably excited.

Preferred embodiments may be found in the dependent claims and the description below, distinction not always being made in detail between device and use aspects in the presentation; in any event, the disclosure is implicitly to be read in relation to all claim categories.

The optics thus have a dual use, i.e. on the one hand to guide the illumination light away from the illumination light emission surface (IL emission surface), but on the other hand also to guide the pump radiation thereto. Just as on the one hand the illumination light ray bundles (IL ray bundles) emitted at different positions of the IL emission surface are directed by the optics respectively into a different spatial direction, on the other hand the optics direct the pump radiation bundles incident from different spatial directions onto different positions of the IL emission surface.

Using the optics in the case of the illumination light, the position distribution on the IL emission surface is converted into an angular distribution on the illumination side, and in the case of the pump ray bundle an angular distribution on the illumination side is converted into a position distribution on the IL emission surface. The IL emission surface is thus at the same time a pump radiation incident surface (but will continue to be referred to below only as an IL emission surface). On the opposite rear side of the luminescent element, a sink may advantageously be arranged, for instance also consisting of metal. Because of the position-dependent excitation of the IL emission surface, emission of the illumination light correspondingly also takes place position-dependently and therefore into the desired spatial directions.

With the pump radiation unit, the pump ray bundles can be emitted adjustably in different spatial directions, so that they correspondingly adjustably strike the illumination side of the optics while coming from the different spatial directions; by the latter, they are then directed onto the different positions of the IL emission surface. Excitation and therefore emission patterns on the IL emission surface can correspondingly be produced adjustably.

Thus, if for example only a subregion of the IL emission surface is excited with pump radiation, illumination light will also be emitted only in this subregion. Correspondingly, illumination light will then only be emitted in the spatial directions corresponding on the illumination side to the subregion; a solid angle range which corresponds to a remaining region of the IL emission surface, complementary to the subregion, remains dark.

The "luminescent material side" of the optics faces toward the luminescent element, specifically its IL emission surface; the illumination light emitted at the IL emission surface enters the optics on the luminescent material side, or at least a part thereof does, for instance at least 25%, advantageously at least 50%, particularly advantageously at least 75%. The illumination light passes through the optics and then emerges on the opposite "illumination side".

The "luminescent element" need not in general be static, but may for example also be a rotating luminescent element, for example a luminescent wheel or a luminescent roller; a static luminescent element, which is thus provided fixed in position and orientation relative to the optics, is however preferred. In general, the pump radiation could also be converted into shorter-wavelength illumination light (up-conversion), although down-conversion is preferred, i.e. the illumination light has a longer wavelength compared with the pump radiation. The pump radiation may, for example, lie in the ultraviolet or blue spectral range.

In general, "adjustable emission" (of a respective pump ray bundle) may for example also mean that, although the intensity of a respective pump ray bundle varies during operation of the illumination device, it does not become equal to zero. The pump radiation unit should have "direction competence", so that the intensity of the pump ray bundles striking the illumination side from different spatial directions can be adjusted for each pump ray bundle and therefore each spatial direction. Because of the angle/position transformation by the optics the different positions of the IL emission surface can thus respectively be supplied with pump radiation adjustably per se.

Advantageously, the pump ray bundles can be switched on and fully off (I=0). To this extent, "adjustable" then means switchable on and off, specifically during operation of the illumination device. The switching off may advantageously be carried out by turning off the pump radiation source itself although in general for example also by deviation of the corresponding pump ray bundle in such a way that it does not strike the IL emission surface.

The "spatial direction" of a ray bundle is given by the average value of all the direction vectors of this ray bundle, and each direction vector is weighted with the beam strength associated therewith during this averaging. Advantageously, the ray bundles in question (both pump ray bundles and IL ray bundles) are respectively collimated per se in the region in question, i.e. on the illumination side. The spatial direction of such a ray bundle then corresponds to the direction of its mutually parallel rays; on the other hand, a "ray bundle" is then the totality of the rays parallel to one another on the illumination side.

In a preferred configuration, the optics are thus telecentric on the luminescent material side; the IL ray bundles coming from the different positions of the illumination light emission surface are respectively directed into the different spatial directions while being collimated per se. They can thus generate clearly defined illumination light distributions even at a relatively large distance, for example several tens or even several hundreds of meters. For example, a traffic lane may be illuminated in a defined way; a preferred application field involves motor vehicle headlamps.

More advantageously, in the case of the IL ray bundles respectively collimated per se, the pump ray bundles may then also be coupled in while being respectively collimated per se. The pump ray bundles thus then strike the illumination side of the optics as ray bundles which are respectively parallel per se, but tilted relative to one another in the spatial directions, pass through these optics and strike the IL emission surface while being respectively focused. The collimation is provided on the illumination side of the optics, immediately in front thereof in terms of the pump radiation propagation; the optics respectively concentrate the pump ray bundles per se, specifically inversely to the IL ray bundles (which are respectively collimated per se in the opposite direction by the optics).

One advantage of this embodiment may, for example, be that during the input coupling of the pump ray bundles only the spatial directions to be covered need to be taken into account, while in other regards the optics ensure that each pump ray bundle strikes the IL emission surface while being focused per se. In order to obtain a collimated IL ray bundle on the illumination side, which propagates in a particular spatial direction, a pump ray bundle is directed onto the illumination side of the optics in the spatial direction precisely opposite to this spatial direction.

In a preferred configuration, the optics are an exclusively refractive lens system, which thus shapes the ray bundles only by light refraction. In general, for example, optics having a reflective element could also be envisioned, for example even having a total reflection lens. Even though the preferred exclusively refractive lens system may generally also have aspherical lenses, the free-form surfaces of which are for example optimized by means of a simulator in terms of the desired beam shaping, a lens system constructed exclusively from spherical lenses is preferred.

This lens system may then for example consist of at least three, advantageously at least four, more advantageously at least five, spherical lenses (individual lenses), cf. the exemplary embodiments for illustration. With a larger number of spherical lenses, or with aspherical lenses it is possible to increase the efficiency, i.e. IL ray bundles with larger aperture angles can be collimated, and more illumination light can thus be collected; specifically, the emission at the IL emission surface typically takes place in a Lambertian fashion.

In a preferred configuration, the pump radiation unit has an input coupling mirror, via which the pump ray bundles are directed onto the optics, i.e. onto the illumination side thereof. Away from the input coupling mirror, the pump ray bundles then have the respective spatial direction with which they strike the optics. The input coupling mirror is arranged in the beam path of the IL ray bundles, and advantageously where the IL ray bundles are respectively collimated per se. There, the aperture angle of each IL ray bundle is essentially equal to zero (within the scope of what is technically conventional), i.e. in any event is very small, for which reason, (because of the conservation of etendue) the beam cross section taken perpendicularly to the propagation direction is conversely maximum. Even a mirror which is reflective for the illumination light ("full mirror") may therefore be arranged in the beam path, even though it cuts out a small region from each IL ray bundle; the mirror and therefore the shadowed region may, however, be kept small in relation to the beam cross section.

For this reason as well, pump ray bundles with a high power density are preferred; the pump ray bundles (or a primary ray bundle on which these are based, see below) may advantageously be compressed, for example with a staircase mirror or a telescope. The power density of the primary ray bundle/the pump ray bundle is thus increased.

The input coupling mirror should, for example, shadow no more than 30%, advantageously no more than 20%, more advantageously no more than 10% of an IL ray bundle, advantageously of each IL ray bundle. This means that, for a respective IL ray bundle, a perpendicular projection of the input coupling mirror into a plane perpendicular to the IL ray bundle direction covers no more than a corresponding percentage of the beam cross section (of the respective IL ray bundle) in the corresponding plane.

In general, the input coupling mirror may for example also be dichroic, i.e. reflect the pump light but transmit the illumination light (in each case at least for the most part, i.e. for example at least 60%, 70% or 80%). Arrangement in the region of the IL ray bundles respectively collimated per se may then, for example, also offer an advantage if the variance of the incidence angles can be minimized there (and the transmission/reflection properties also depend on the incidence angle). Advantageously, however, a solid mirror is provided as the input coupling mirror, which may offer advantages for example in terms of robustness and costs.

In one preferred embodiment, the pump radiation unit has a deviating mirror, which a primary ray bundle emitted by the pump radiation source strikes and is deviated therefrom as a function of a mirror setting (of the deviating mirror) as at least one of the pump ray bundles. In general, for example, an adjustable diffraction grating could also be provided for deviating the pump ray bundles into different spatial directions, or the pump radiation source could itself be moved.

The preferred deviating mirror may, for example, be provided as a microscanner which can be tilted in at least one axis, advantageously in two mutually perpendicular axes. If a primary ray bundle then strikes the microscanner, it will be deviated as a function of the mirror setting as one of the pump ray bundles; in another mirror setting, a different pump ray bundle is correspondingly obtained (which differs in its direction from the previous one). With movement of the mirror, arbitrarily many pump ray bundles may to this extent be obtained; when a primary ray bundle is incident, there is one "pump ray bundle" per mirror setting.

In the course of time, the pump ray bundles may then, for example, excite the IL emission surface in rows and/or columns. As a function of the desired light distribution in the far-field, the power of the pump radiation source may be increased and reduced in time with the microscanner, or the pump radiation source may thereby be switched on and off in time.

The microscanner is an optoelectromechanical system (MOEMS), i.e. a micromirror actuator.

The pump ray bundles are present sequentially at the microscanner, in any event so far as they originate from the same primary ray bundle; in the case of a plurality of pump radiation sources and therefore a plurality of primary ray bundles a plurality of pump ray bundles may also be present simultaneously.

In general, the deviating mirror may at the same time also be the input coupling mirror, i.e. it may be arranged in the beam path of the IL ray bundles. They are, however, advantageously two separate mirrors and the input coupling mirror is advantageously arranged after the deviating mirror as a part fixed in position and orientation in the beam path of the IL ray bundles. The input coupling mirror should thus be fixed in its position relative to the optics and also should not be rotatable/tiltable. This is advantageous in that a holder can then be configured correspondingly simply and therefore produces little shadowing.

The deviating mirror arranged before the input coupling mirror in terms of the pump radiation propagation may be arranged outside the beam path of the IL ray bundles, so that for example it is also possible to use a standardly housed component with a small mirror surface in relation to the component size.

This may for example offer cost advantages, particularly in mass production.

In one preferred refinement, a relay lens system is provided between the input coupling mirror and the deviating mirror arranged in front in terms of the pump radiation propagation ("between" in relation to the path of the pump radiation). This lengthens the optical path, which may be of benefit for example in terms of the preferred application field "motor vehicle headlamp"; this is because the pump radiation source may then be arranged some way away from the optics/luminescent element unit, which may for example be subject to particular spatial restrictions for design reasons.

Figure 2:
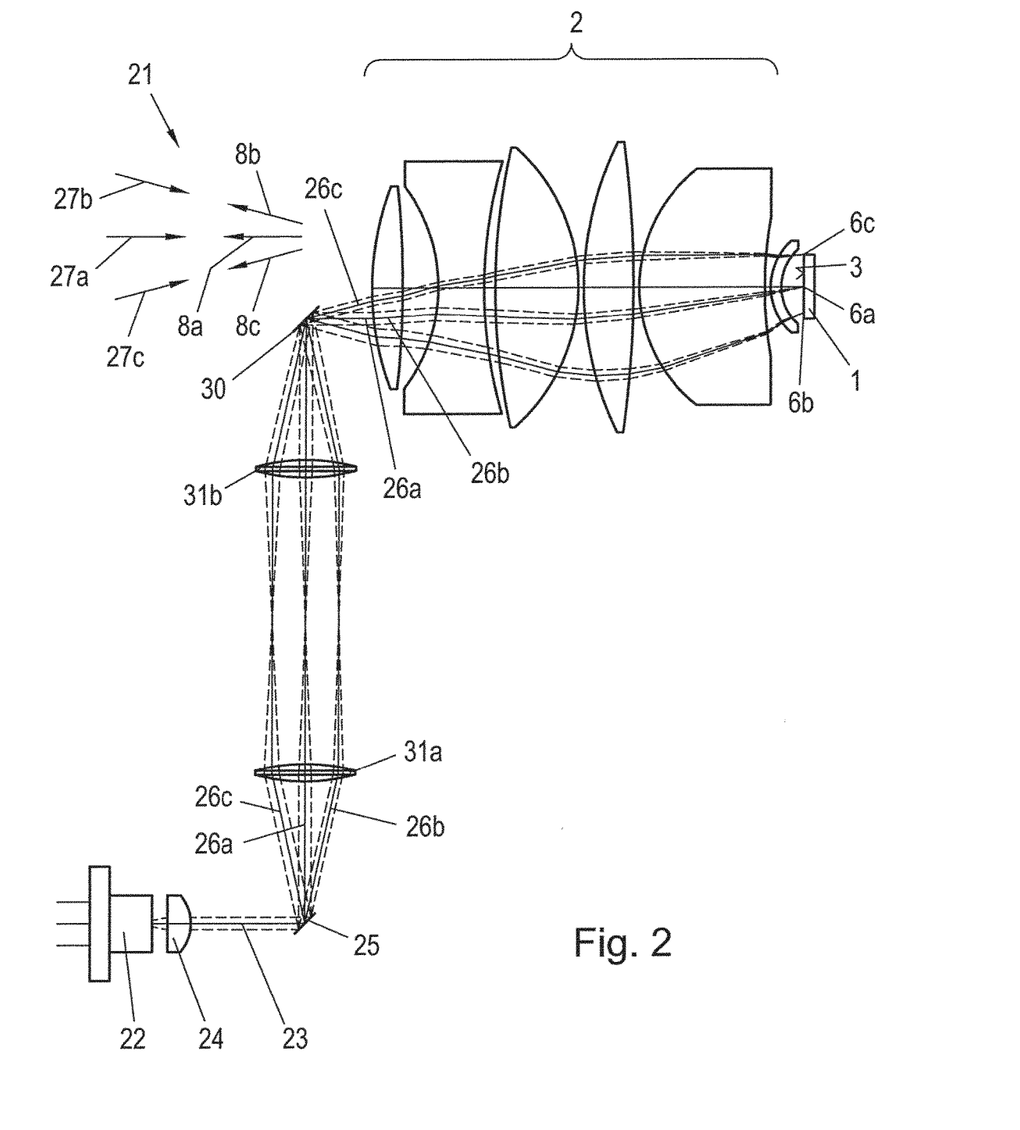
FIG. 2 shows the input coupling of the pump radiation into the optics according to FIG. 1.

The relay lens system images the deviating mirror onto the input coupling mirror; as a consequence, pump ray bundles which leave the deviating mirror in different directions are recombined on the input coupling mirror; see for example FIG. 2 for illustration. In the figures, the imaging scale M=1:1 (image/object), but a different scale may also be of benefit. Advantageous lower limits may for example be 1:10, 1:5 or 1:2, and advantageous upper limits for instance 10:1, 5:1 or 2:1, in each case increasingly preferred in the order mentioned (upper and lower limits may also be of benefit independently of one another).

Though a single lens could even be provided as the relay lens system in general, a system of at least two lenses is preferred; the number of lenses of the relay lens system may for example be 2n, with n=1, 2, 3, 4 or 5 (even higher values are possible in general).

In a preferred configuration, the input coupling mirror is arranged at the focal point, on the luminescent material side, of the output lens of the relay lens system, i.e. the last lens of the system in relation to the pump radiation propagation. In front of this, the pump ray bundles are then collimated relative to one another, so that they strike the input coupling mirror while being concentrated relative to one another. The output lens (and therefore also the rest of the relay lens system) is advantageously arranged outside the beam path of the IL ray bundle. Respectively per se, each of the pump ray bundles is advantageously divergent in front of the output lens, so that each pump ray bundle is collimated per se by the output lens.

In a preferred configuration, the deviating mirror is arranged at the focal point, on the pump radiation source side, of the input lens of the relay lens system, i.e. the first lens of the system in relation to the pump radiation propagation. Pump ray bundles emerging from the deviating mirror while being divergent relative to one another are then collimated relative to one another by the input lens and may then, for example, in the case of a system of two lenses, strike the output lens in such a state (see above). The pump ray bundles are advantageously respectively collimated per se in front of the output lens, therefore each pump ray bundle is focused per se by the input lens (and then collimated again by the output lens, see above).

In the particularly preferred case of the relay lens system consisting of two lenses, namely an input lens and an output lens, these two lenses are advantageously arranged in such a way that the focal point, on the luminescent material side, of the input lens coincides with the focal point, on the pump radiation source side, of the output lens. Advantageously, the input and output lenses are each per se symmetrical and have the same focal length.

In one preferred embodiment, a plurality of pump radiation units may also be provided, for example at least 2, 3, 4 or 5 pump radiation units; possible upper limits are, for example, at most 15, 10 or 8 pump radiation units. The pump radiation units may, for example, also differ in their wavelength, and excitation may thus be carried out with pump radiation of different wavelengths. The pump radiation units may, for example, differ in their dominant wavelength; one pump radiation unit may for example be optimized for good color rendering/color temperature, and the other for good efficiency/lifetime.

In the case of a plurality of pump radiation units as well, the entire IL emission surface may generally be excited with each of them; advantageously, however, the IL emission surface is then subdivided into subregions, a pump radiation source being assigned to each of them (the subregions should then at least partially not overlap).

Each pump radiation unit has its own pump radiation source; advantageously, however, a multiplicity of pump radiation units share a common input coupling mirror. In general, a plurality of input coupling mirrors may in this case also be provided, to which a plurality of pump radiation sources are respectively assigned. The multiplicity of pump radiation sources may, for example, also be arranged circumferentially distributed (in relation to a revolution about the optical axis of the optics), which may for example be of benefit in a projection application, for instance in the field of digital cinematic projection.

Advantageously, precisely one input coupling mirror is provided and a plurality of pump radiation sources are assigned thereto, which may be advantageous in terms of minimization of the shadowing.

Figure 3:
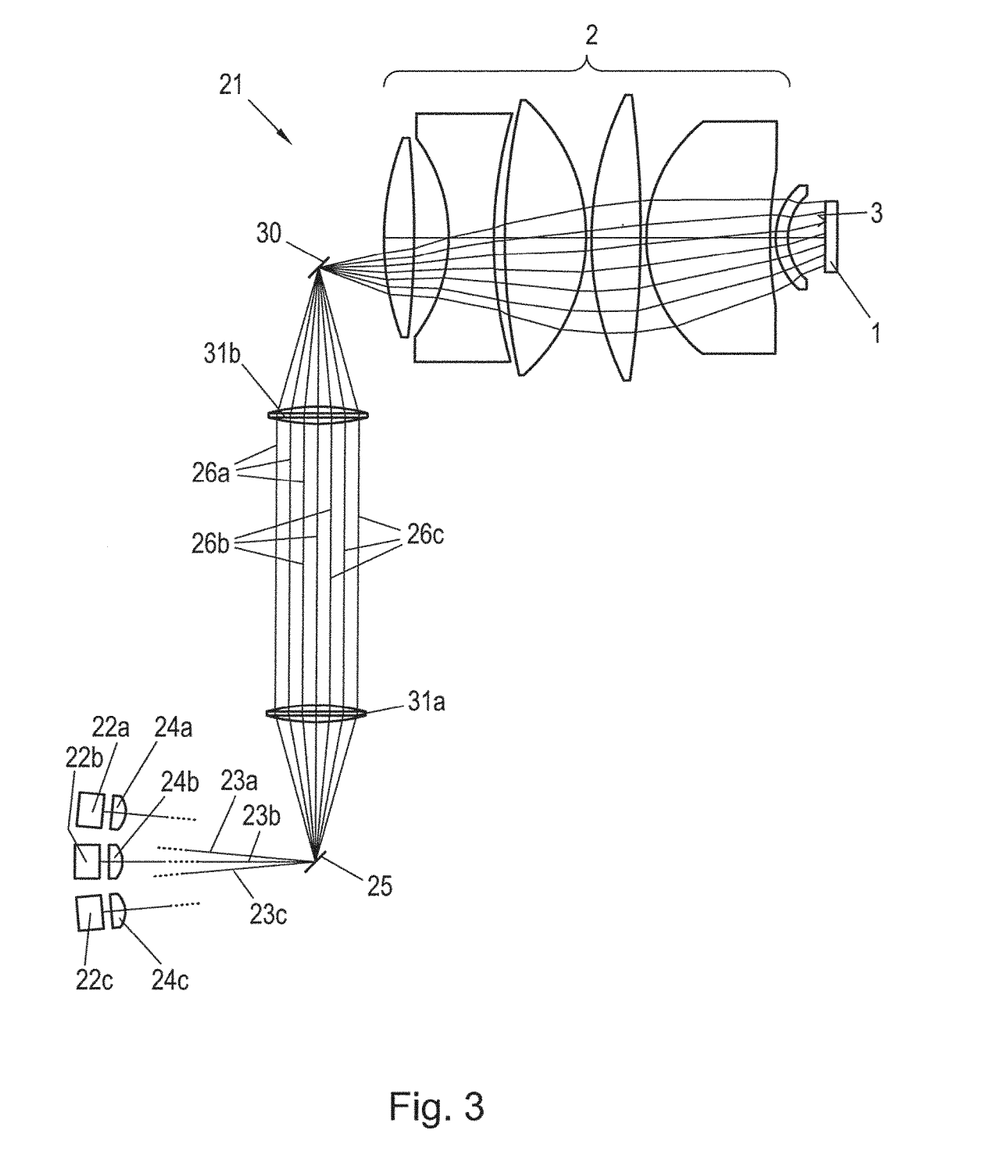
FIG. 3 shows an illumination device according to various embodiments with three pump radiation sources.

In addition to the input coupling mirror, a plurality of pump radiation sources may, for example, also share a deviating mirror and, if present, a relay lens system as further common element/elements, cf. FIG. 3 for illustration. Also in the case of a microscanner as the deviating mirror, a plurality of pump ray bundles may then strike the IL emission surface simultaneously, namely a number of pump ray bundles corresponding to the number of pump radiation sources; these may then, for example, be switched on and off individually.

The present disclosure also relates to a motor vehicle headlamp having an illumination device as disclosed here, advantageously a motor vehicle front headlamp. The motor vehicle headlamp may, for example, also have a control and/or detection unit. As a detection unit, for instance, it is possible to provide a camera which detects the region that is accessible on the illumination side to the IL ray bundles, i.e. the region illuminated during excitation of the entire IL emission surface. If, for example, oncoming traffic or a vehicle driving in front then enters this region, this is evaluated by the control unit and the excitation of the corresponding region of the IL emission surface is switched off.

The present disclosure also relates to the use of an illumination device as described here for a motor vehicle headlamp. The present disclosure furthermore relates to the use of an illumination device as described here, or of a corresponding motor vehicle headlamp, wherein different spatial directions are illuminated selectively with the illumination light ray bundles by excitation of the different positions of the luminescent element. Alternative application fields to the motor vehicle headlamp may, for example, lie in the area of stage or operation field illumination, i.e. the illumination device may also be part of a stage spotlight or an OP lamp.

In general, not all of the pump radiation may converted (full conversion), but only a part is converted and a mixture of pump radiation (pump light) and conversion light is then used (partial conversion). In general, the working light may advantageously be white light; in the case of partial conversion, the white light may, for example, then be obtained from blue pump light and the conversion light, for which purpose yellow conversion light (and correspondingly a yellow luminescent material) is preferred. For example, YAG:Ce may be provided as a yellow luminescent material.

BRIEF DESCRIPTION OF THE DRAWINGS

The present disclosure will be explained in more detail below with the aid of exemplary embodiments, in the context of which the individual features in the scope of application of the independent claims may also be essential to the present disclosure in other combinations; furthermore, a distinction is not made in detail between the claim categories.

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

Figure 1:
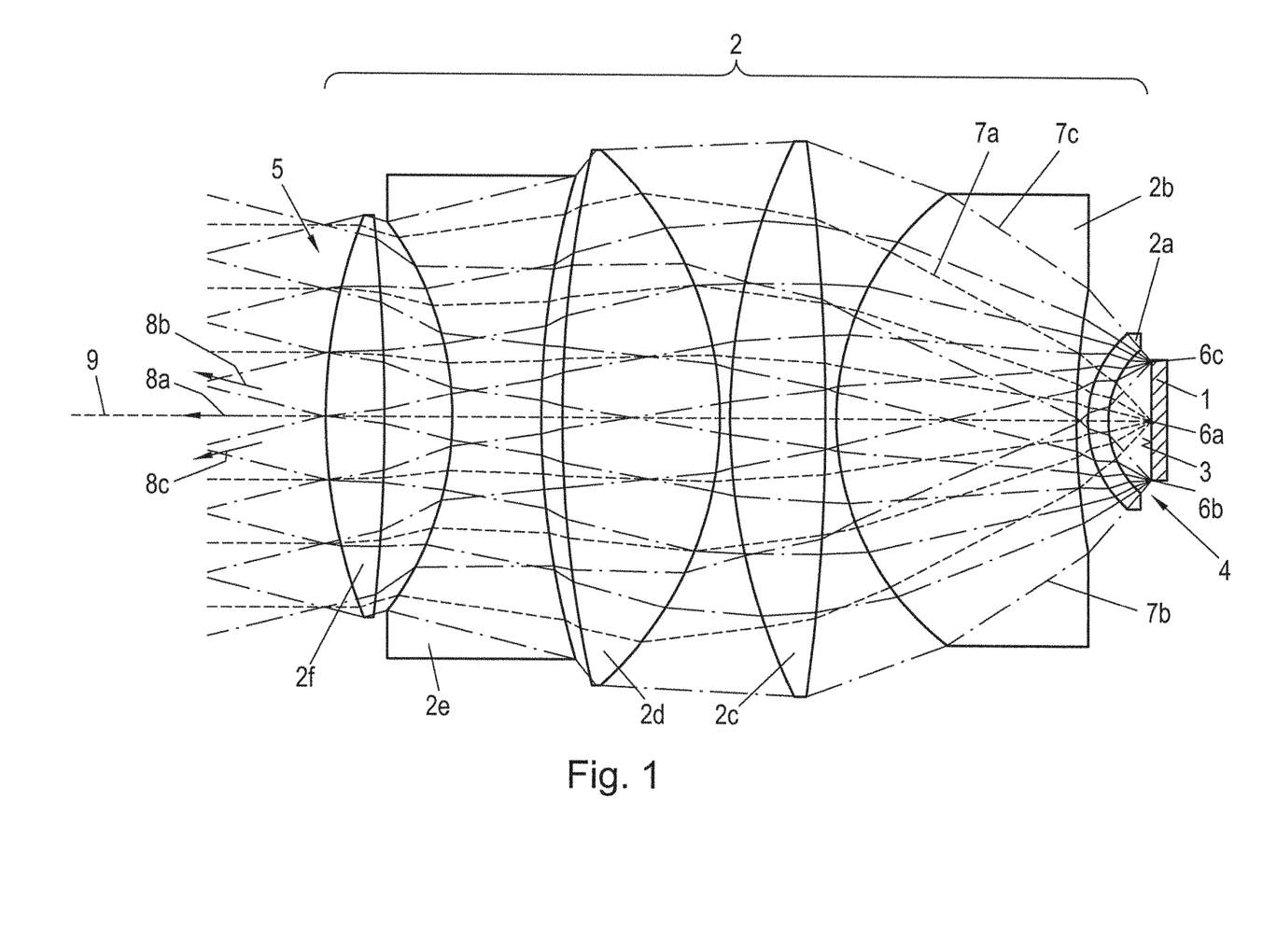
FIG. 1 shows the beam path of illumination light ray bundles in optics of an illumination device according to various embodiments.

FIG. 1 shows a part of an illumination device according to various embodiments, namely a luminescent element 1 with assigned optics 2. The optics 2 are constructed from six spherical lenses, with which the illumination light emitted at an illumination light emission surface 3 of the luminescent element 1 is collected and delivered to an illumination application, i.e. it is used for the illumination of a road by means of a motor vehicle headlamp.

The illumination light enters the optics 2 on a luminescent material side 4, passes through these optics and emerges again from the optics at an opposite illumination side 5. In relation to the direction of the illumination light, the optics 2 are constructed from a first meniscus 2a and a second meniscus 2b, two asymmetrical biconvex lenses 2c,d, an asymmetrical biconcave lens 2e and a further asymmetrical biconvex lens 2f.

The arrangement is telecentric on one side, and the optics 2 respectively collimate per se illumination light ray bundles 7a,b,c coming from different positions 6a,b,c of the IL emission surface 3. The position distribution on the illumination light emission surface 3 is converted by the optics 2 into an angular distribution, the IL ray bundles coming from the different positions 6a,b,c of the IL emission surface 3 after the optics 2 therefore respectively have a different spatial direction 8a,b,c. In this case, each of the IL ray bundles is then collimated per se after the optics 2.

Because of the correlation of the position distribution on the IL emission surface 3 with the angle distribution on the illumination side, a different light distribution can be achieved on the illumination side by different excitation of the positions 6a,b,c of the IL emission surface 3. In the present case, a section containing the optical axis 9 of the optics 2 is shown, and only three IL ray bundles 7 are represented by way of example for this section. Nevertheless, a corresponding ray bundle may come from each position of the IL emission surface 3, or the associated regions of the IL emission surface 3 may then be deliberately not excited as a function of the desired light distribution on the illumination side.

FIG. 2 then illustrates a corresponding illumination device 21 as a whole, i.e. the luminescent element 1 with the optics 2 and a pump radiation unit for exciting the luminescent element 1. The pump radiation unit has a pump radiation source 22, specifically a laser diode. A primary ray bundle 23 emitted thereby, in the present case blue laser light, is collimated with a collimation lens 24 and thus strikes a microscanner 25, specifically an optoelectromechanical micromirror actuator. The latter can be tilted about two axes, about an axis perpendicular to the plane of the drawing (which is relevant for the present section) and about an axis lying in the plane of the drawing.

The primary ray bundle 23 strikes the microscanner 25 and is deviated as a function of the mirror setting as a respective pump ray bundle 26. The deviation is shown by way of example in the figure for three pump ray bundles 26a,b,c, these pump ray bundles 26a,b,c being present not simultaneously but sequentially. By means of elements of the pump radiation unit, which are described in more detail below, the pump ray bundles 26a,b,c are then delivered to the luminescent element 1, specifically via the optics 2.

In order to excite a particular position 6a,b,c of the IL emission surface 3, a respective pump ray bundle 26a,b,c is thus directed in a respective pump radiation spatial direction 27a,b,c onto the illumination side of the optics 2, which pump radiation spatial direction 27a,b,c lies precisely opposite the respective spatial direction 8a,b,c of the IL ray bundle 7a,b,c emitted from the associated position 6a,b,c of the IL emission surface 3.

Thus, by a respective pump ray bundle 26a,b,c striking the illumination side 5 of the optics 2 in a respective spatial direction 27a,b,c, a respective position 6a,b,c of the IL emission surface 3 is excited; the IL ray bundle 7a,b,c emitted in response to the excitation at the respective position 6a,b,c of the IL emission surface 3 is collimated per se by the optics 2 and emitted on the illumination side in a spatial direction 8a,b,c which is precisely opposite to the spatial direction 27a,b,c of the corresponding pump ray bundle 26a,b,c. Thus, by excitation being carried out from a particular spatial direction 27a,b,c, emission of the conversion light takes place in precisely the opposite spatial direction 8a,b,c.

By the tilting, illustrated in the figure, of the microscanner 25 about the axis perpendicular to the plane of the drawing and the tilting (not represented) about the axis lying in the plane of the drawing, the entire IL emission surface 3 can be scanned, i.e. with a pump radiation source 22 continuously switched on, the entire IL emission surface 3 can be excited on average. If an oncoming vehicle or a vehicle driving in front in the illumination range is then detected with a camera for example, the emission of the conversion light in the corresponding spatial directions 8a,b,c is switched off. To this end, excitation is thus no longer carried out in the opposite spatial directions 27a,b,c, i.e. the pump radiation source 22 is switched off for corresponding positions of the microscanner 25.

Besides the microscanner 25, the primary radiation unit furthermore includes an input coupling mirror 30, which is arranged as a part fixed in location and position in the beam path of the IL ray bundles 7. Since the beam cross section of the primary ray bundle 23, and therefore of the pump ray bundle 26, is small, the input coupling mirror 30 also has a small surface in comparison with the cross section of the IL ray bundle 7, i.e. it shadows only little illumination light. For this reason as well the input coupling mirror 30 is configured as a passive component, which is thus arranged fixed in location and position, which allows a holder (not represented) which is correspondingly simple and therefore does not shadow greatly.

Between the deviating mirror 25 and the input coupling mirror 30, a relay lens system 31 having an input lens 31a and an output lens 31b is provided. The input lens 31a and the output lens 31b have the same focal length; the deviating mirror 25 is arranged at the focal point, on the pump radiation source side, of the input lens 31, and the input coupling mirror 30 is arranged at the focal point, on the luminescent material side, of the output lens 31b; the input lens 31a and the output lens 31b are separated from one another by two times their focal length.

Each pump ray bundle 26 is concentrated per se by the input lens 31a and is then re-collimated by the output lens 31b. All of the pump ray bundles 26 are divergent relative to one another in front of the input lens 31a, are collimated by the input lens 31a and then strike the input coupling mirror 30 having been concentrated by the output lens 31b.

FIG. 3 shows another illumination device 21 according to various embodiments, the luminescent element 1 and the optics 2 being structurally equivalent to the elements of the illumination device 21 according to FIG. 2. In the case of the illumination device 21 according to FIG. 3, however, three pump radiation sources 22a,b,c are provided, each of which emits a primary ray bundle 23a,b,c. The primary ray bundles 23a,b,c are then guided by means of the common microscanner 25, each of the primary ray bundles 23a,b,c being spread out according to the description above. Unlike FIG. 2, the allocation of the letters in the references of the pump ray bundles 26a,b,c is now no longer correlated with the IL ray bundles 7a,b,c but rather with the primary ray bundles 23a,b,c. The IL emission surface 3 is now no longer excited with a single primary ray bundle 23, which correspondingly needs to be guided on average over the entire IL emission surface 3, but in fact with three primary ray bundles 23a,b,c.

Correspondingly, the IL emission surface 3 is subdivided into subregions, each of which is excited with one of the primary ray bundles 23a,b,c (and which partially overlap). Ultimately, however, the same functionality is obtained, i.e. particular regions are not excited as a function of image information recorded with a camera, which is then achieved by switching off one or more of the pump radiation sources 22a,b,c.

Figure 4:
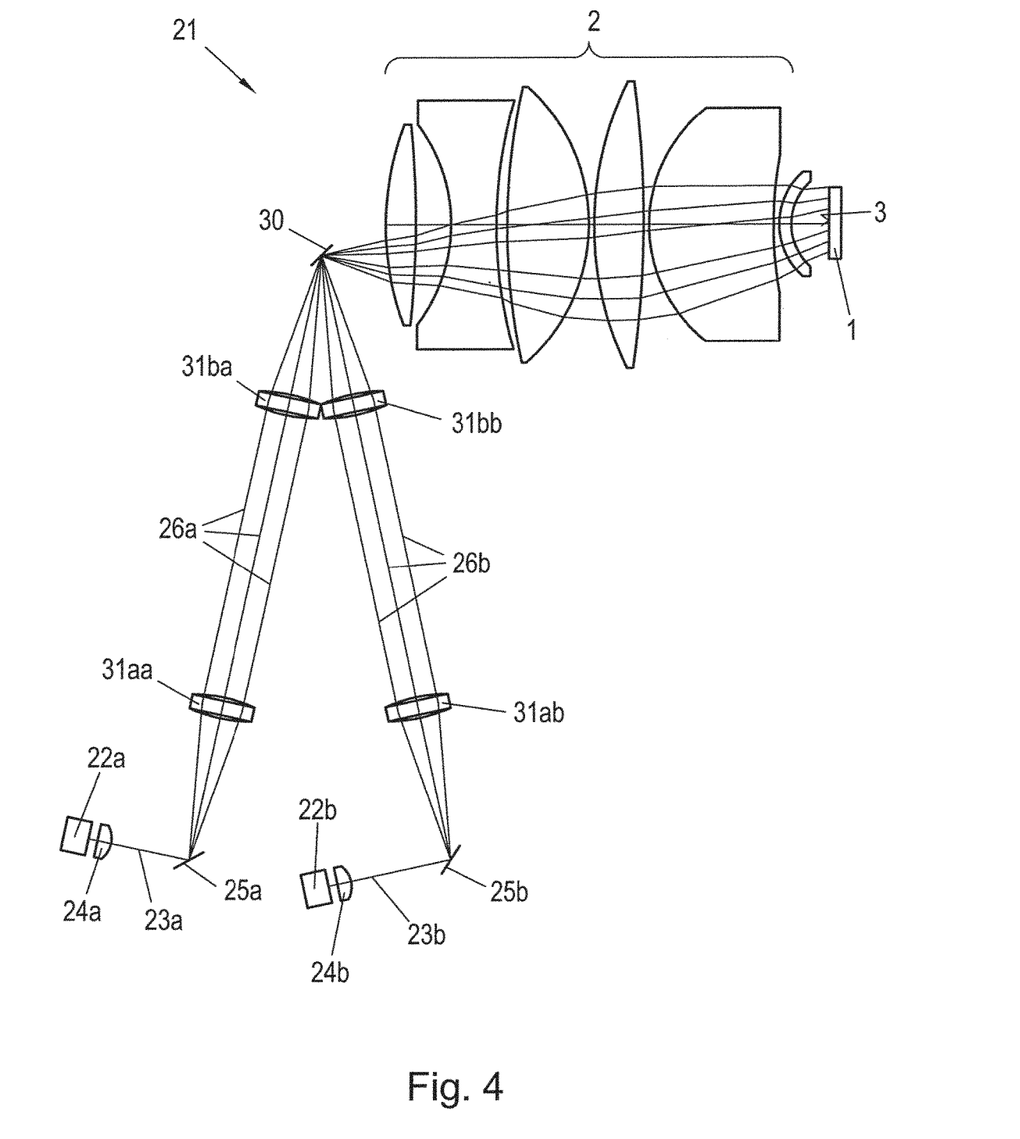
FIG. 4 shows an illumination device according to various embodiments with two pump radiation sources, each of which is assigned its own deviating mirror.

The illumination device 21 according to FIG. 4 also corresponds in terms of the luminescent element 1 and optics 2 to the embodiments described so far. Furthermore, the illumination device 21 according to FIG. 4 is also provided with two pump radiation sources 22a,b, although in this case they share only the input coupling mirror 30. Apart from this, each pump radiation unit has its own relay lens system 31 and its own deviating mirror 25 (in respect of the function of these elements in detail, reference is made to the description above).

The respective primary ray bundle 23a,b coming from a respective pump radiation source 22a,b is spread out by the respective deviating mirror 25a,b (in the course of time) and guided by means of a respective downstream relay lens system 31aa,ba,ab,bb. The two pump radiation units then share the input coupling mirror 30 arranged thereafter, which is also advantageous in terms of minimizing the shadowing. Finally, each pump radiation source 22a,b again excites only a subregion of the IL emission surface 3, cf. the description regarding FIG. 3.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An illumination device for variable illumination in different spatial directions comprising,
   a pump radiation unit, which has a pump radiation source for emitting pump radiation, a luminescent element for at least partial conversion of the pump radiation into illumination light, which is emitted in response to excitation with the pump radiation on an illumination light emission surface of the luminescent element, and optics assigned to the luminescent element for and respectively directing illumination light ray bundles striking the optics on a luminescent material side thereof from different positions of the illumination light emission surface, into a different spatial direction of a propagation on an illumination side opposite to the luminescent material side, wherein the pump radiation unit is configured to respectively emit a pump ray bundle adjustably in different spatial directions, which pump ray bundles are coupled in on the illumination side, wherein the optics convert the angular distribution on the illumination side into a position distribution on the illumination light emission surface to permit adjustable excitation of different positions of the luminescent element.

2. The illumination device as claimed in claim 1, wherein the arrangement of the optics and the illumination light emission surface is telecentric on one side, and the optics respectively collimate per se the illumination light ray bundles coming from the different positions of the illumination light emission surface, the pump ray bundles respectively striking the optics on the illumination side while being collimated per se.

3. The illumination device as claimed in claim 1, wherein the optics are an exclusively refractive lens system.

4. The illumination device as claimed in claim 1, wherein the pump radiation unit has an input coupling mirror, via which the pump ray bundles are coupled in and which is to this end arranged in a beam path of the illumination light ray bundles.

5. The illumination device as claimed in claim 4, wherein the pump radiation unit has a deviating mirror, which a primary ray bundle emitted by the pump radiation source strikes and is deviated therefrom as a function of a mirror setting as one of the pump ray bundles.

6. The illumination device as claimed in claim 5, wherein the deviating mirror is arranged outside the beam path of the illumination light ray bundles, and the input coupling mirror is arranged after the deviating mirror as a part fixed in position and orientation in the beam path of the illumination light ray bundles.

7. The illumination device as claimed in claim 6, wherein the pump radiation unit has a relay lens system, which is arranged between the deviating mirror and the input coupling mirror.

8. The illumination device as claimed in claim 7, wherein the relay lens system has an output lens, the input coupling mirror being arranged after the output lens at the focal point of the latter.

9. The illumination device as claimed in claim 7, wherein the relay lens system has an input lens, the deviating mirror being arranged before the input lens at the focal point of the latter.

10. The illumination device as claimed in claim 5, wherein a microscanner, which can be tilted in at least one axis, is provided as the deviating mirror.

11. The illumination device as claimed in claim 4, wherein the illumination device has a plurality of pump radiation units which share at least the input coupling mirror as a common element.

12. A motor vehicle headlamp having an illumination device comprising, a pump radiation unit, which has a pump radiation source for emitting pump radiation, a luminescent element for at least partial conversion of the pump radiation into illumination light, which is emitted in response to excitation with the pump radiation on an illumination light emission surface of the luminescent element, and optics assigned to the luminescent element for and respectively directing illumination light ray bundles striking the optics on a luminescent material side thereof from different positions of the illumination light emission surface, into a different spatial direction of a propagation on an illumination side opposite to the luminescent material side, wherein the pump radiation unit is configured to respectively emit a pump ray bundle adjustably in different spatial directions, which pump ray bundles are coupled in on the illumination side, wherein the optics convert the angular distribution on the illumination side into a position distribution on the illumination light emission surface to permit adjustable excitation of different positions of the luminescent element.

13. The motor vehicle headlamp as claimed in claim 12, further comprising a detection unit configured to detect a region that is accessible on the illumination side to the illumination light ray bundles.

14. A method for using an illumination device for a motor vehicle headlamp comprising, emitting pump radiation by a pump radiation source of a pump radiation unit, exciting, by the pump radiation, an illumination light emission surface of a luminescent element, converting, at least partially, the pump radiation into illumination light by said excitation of the luminescent element, assigning optics to the luminescent element, and directing into different spatial directions of a propagation on an illumination side of the optics, respectively, illumination light ray bundles striking the optics, from different positions of the illumination light emission surface on a luminescent material side of the optics opposite the illumination side, wherein the pump radiation unit is configured to respectively emit a pump ray bundle adjustably in different spatial directions, which pump ray bundles are coupled in on the illumination side, wherein the optics convert the angular distribution on the illumination side into a position distribution on the illumination light emission surface to permit adjustable excitation of different positions of the luminescent element.

15. The method as claimed in claim 14 further comprising, illuminating, selectively, different spatial directions with the illumination light ray bundles by excitation of the different positions of the illumination light emission surface.

16. The illumination device as claimed in claim 3, wherein the exclusively refractive lens system consists of a multiplicity of spherical lenses.

* * * * *